United States Patent
Kanamaru et al.

(10) Patent No.: US 9,876,157 B2
(45) Date of Patent: Jan. 23, 2018

(54) SURFACE MOUNT TYPE QUARTZ CRYSTAL DEVICE

(71) Applicant: NIHON DEMPA KOGYO CO., LTD., Tokyo (JP)

(72) Inventors: Akihiro Kanamaru, Saitama (JP); Takuya Kuwayama, Saitama (JP); Yasunori Hosokawa, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 557 days.

(21) Appl. No.: 14/331,232

(22) Filed: Jul. 15, 2014

(65) Prior Publication Data
US 2015/0022060 A1    Jan. 22, 2015

(30) Foreign Application Priority Data

Jul. 19, 2013  (JP) ................................. 2013-150645
Mar. 13, 2014  (JP) ................................. 2014-049779

(51) Int. Cl.
*H01L 41/08* (2006.01)
*H01L 41/053* (2006.01)
*H03H 9/05* (2006.01)
*H03H 9/10* (2006.01)

(52) U.S. Cl.
CPC ......... *H01L 41/053* (2013.01); *H03H 9/0538* (2013.01); *H03H 9/0552* (2013.01); *H03H 9/1021* (2013.01)

(58) Field of Classification Search
CPC .. H03H 9/0538; H03H 9/0552; H03H 9/1021; H01L 41/053
USPC .......... 310/344, 348, 313 A–313 R, 365–367
See application file for complete search history.

(56) References Cited

U.S. PATENT DOCUMENTS

2015/0123742 A1*  5/2015  Naito ....................... H03H 9/17
                                                        310/348

FOREIGN PATENT DOCUMENTS

| JP | H2-291710    | 12/1990 |            |
|----|--------------|---------|------------|
| JP | H06-54315    | * 7/1994 | ............... H03H 9/02 |
| JP | H6-54315     | 7/1994  |            |
| JP | 2006-013650  | 1/2006  |            |
| JP | 2007-195138  | 8/2007  |            |

(Continued)

OTHER PUBLICATIONS

"Office Action of Japan Counterpart Application", dated Aug. 10, 2015, p. 1-p. 5.

*Primary Examiner* — Thomas Dougherty
*Assistant Examiner* — Karen B Addison
(74) *Attorney, Agent, or Firm* — JCIPRNET

(57) ABSTRACT

A surface mount type quartz crystal device according to a first aspect of the disclosure includes a ceramic package, a pedestal blank, a quartz-crystal vibrating piece. The pedestal blank is placed within the ceramic package via a conductive adhesive. The quartz-crystal vibrating piece is placed on the pedestal blank. The conductive adhesive is formed along an outer peripheral side of the pedestal blank so as to avoid overlap with the excitation electrode viewed in a normal direction of the excitation electrode. The pedestal blank is formed to avoid a region where a distance from the quartz-crystal vibrating piece is equal to or smaller than a size of a clearance between the pedestal blank and the quartz-crystal vibrating piece at the outer peripheral side, in a region where the excitation electrode faces at the pedestal blank side viewed in the normal direction.

7 Claims, 10 Drawing Sheets

(56) References Cited

FOREIGN PATENT DOCUMENTS

| | | |
|---|---|---|
| JP | 2009-253883 | 10/2009 |
| JP | 2010-135890 | 6/2010 |

\* cited by examiner

US 9,876,157 B2

SURFACE MOUNT TYPE QUARTZ CRYSTAL DEVICE

CROSS-REFERENCE TO RELATED APPLICATIONS

This application claims the priority benefit of Japan application serial no. 2014-049779 filed on Mar. 13, 2014 and No. 2013-150645 filed on Jul. 19, 2013. The entirety of the above-mentioned patent applications are hereby incorporated by reference herein and made a part of this specification.

TECHNICAL FIELD

This disclosure relates to a surface mount type quartz crystal device where a quartz-crystal vibrating piece is placed on a pedestal blank.

DESCRIPTION OF THE RELATED ART

A quartz crystal device where a quartz-crystal vibrating piece is placed on the package is known. As one of the measures to evaluate the quartz crystal device described above, there is a DLD (Drive Level Dependence) characteristic, which indicates the influence of the change of the level of drive condition of the quartz-crystal vibrating piece. The level of drive refers to a measure of the excitation condition which applies a load to the quartz-crystal vibrating piece.

The package of the quartz crystal device may be formed of ceramics. Since the stress is applied to the quartz-crystal vibrating piece due to a difference of thermal expansion between a quartz-crystal material that forms the quartz-crystal vibrating piece and the package and similar at this time, the level of drive of the quartz-crystal vibrating piece sometimes changed, thus changing the DLD characteristic. This brought a change of the frequency characteristics of the quartz-crystal vibrating piece, which resulted in a problem.

In contrast, for example, a crystal controlled oscillator disclosed in Japanese Unexamined Patent Application Publication No. 2006-13650 is placed on the package via the pedestal blank where the quartz-crystal vibrating piece is formed of the same material as the quartz-crystal vibrating piece. When this method is used, the quartz-crystal vibrating piece and the pedestal blank are made of the same material, and the quartz-crystal vibrating piece is not in a direct contact with the package. This prevents the stress caused by the difference of thermal expansion and similar from affecting the quartz-crystal vibrating piece and prevents the DLD characteristic from changing.

In Japanese Unexamined Patent Application Publication No. 2006-13650, however, since the pedestal blank and the quartz-crystal vibrating piece are closely formed, the blank scrap attached to the pedestal blank and similar were sometimes attached to the quartz-crystal vibrating piece, changing the DLD characteristic of the quartz-crystal vibrating piece.

A need thus exists for a surface mount type quartz crystal device which is not susceptible to the drawback mentioned above.

SUMMARY

A surface mount type quartz crystal device according to a first aspect of the disclosure includes a ceramic package, a pedestal blank, a quartz-crystal vibrating piece. The pedestal blank is formed of a quartz-crystal material. The pedestal blank is placed within the ceramic package via a conductive adhesive. The quartz-crystal vibrating piece is formed in a rectangular shape having a long side and a short side. The quartz-crystal vibrating piece includes a pair of excitation electrodes and a pair of extraction electrodes. The pair of extraction electrodes are extracted from the pair of excitation electrodes to one end of the quartz-crystal vibrating piece in an extending direction of the long side. The quartz-crystal vibrating piece is placed on the pedestal blank. The conductive adhesive is formed along an outer peripheral side of the pedestal blank so as to avoid overlap with the excitation electrode viewed in a normal direction of the excitation electrode. The pedestal blank is formed to avoid a region where a distance from the quartz-crystal vibrating piece is equal to or smaller than a size of a clearance between the pedestal blank and the quartz-crystal vibrating piece at the outer peripheral side, in a region where the excitation electrode faces at the pedestal blank side viewed in the normal direction.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

Hereinafter, a detailed description will be given of embodiments according to this disclosure with reference to the drawings. It will be understood that the scope of this disclosure is not limited to the described embodiments, unless otherwise stated.

Figure 1:
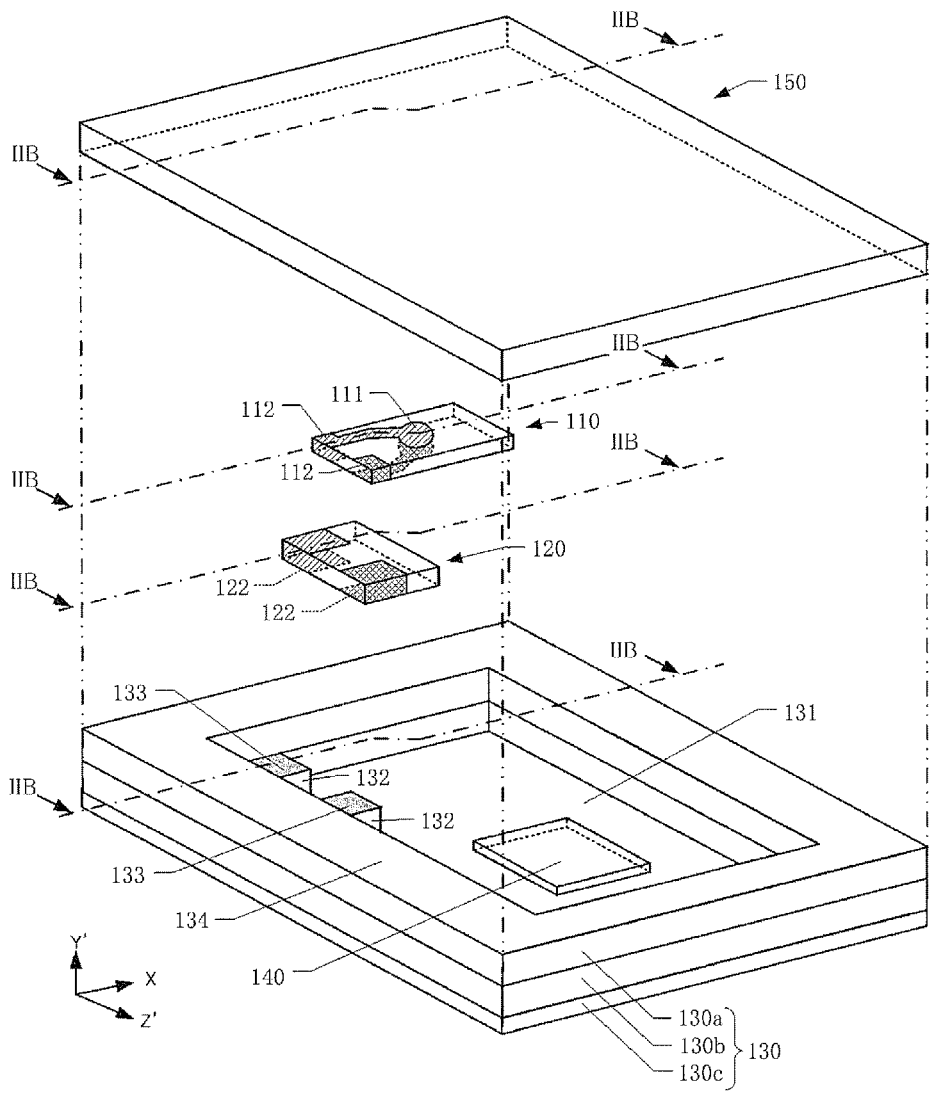
FIG. 1 is an exploded perspective view illustrating a surface mount type quartz crystal device 100.

Constitution of Surface Mount Type Quartz Crystal Device 100 According to First Embodiment FIG. 1 is an exploded perspective view of a surface mount type quartz crystal device 100. The surface mount type quartz crystal device 100 mainly includes a ceramic package 130, an integrated circuit element 140, a pedestal blank 120, a quartz-crystal vibrating piece 110, and a lid plate 150. The surface mount type quartz crystal device 100 is formed as a surface mount type crystal controlled oscillator. For example, an AT-cut quartz-crystal vibrating piece is used as the quartz-crystal vibrating piece 110. The AT-cut quartz-crystal vibrating piece has a principal surface (in the Y-Z plane) that is tilted by 35°15' about the Y-axis of crystallographic axes (XYZ) in the direction from the Z-axis to the Y-axis around the X-axis. In the following description, the new axes tilted with reference to the axis directions of the AT-cut quartz-crystal vibrating piece are denoted as the Y'-axis and the Z'-axis. This disclosure defines the long side direction of the surface mount type quartz crystal device 100 as the Z'-axis direction, the height direction of the surface mount type quartz crystal device 100 as the Y'-axis direction, and the direction perpendicular to the Y' and Z'-axis directions as the X-axis direction.

The ceramic package 130 is made of ceramics and includes a depressed portion 131 having the surface at the +Y'-axis side opened. The integrated circuit element 140 is placed on the depressed portion 131. A pair of placing portions 132 to place the pedestal blank 120 are formed at the −Z'-axis side of the side surface at the −X-axis side in the depressed portion 131 and each of connecting electrodes 133 are formed on the surface at the +Y'-axis side of each of the placing portions 132.

The ceramic package 130 is formed of three layers: a first layer 130a, a second layer 130b, and a third layer 130c by overlapping the three layers. The first layer 130a is arranged at the +Y'-axis side of the ceramic package 130, and a bonding surface 134 is formed on the surface at the +Y'-axis side of the first layer 130a. The bonding surface 134 is to be bonded to the lid plate 150. The second layer 130b is bonded to the surface at the −Y'-axis side of the first layer 130a, and forms the placing portions 132. The third layer 130c is formed on the surface at the −Y'-axis side of the second layer 130b. External electrodes 136 (see FIG. 2B) are formed on the surface at the −Y'-axis side of the third layer 130c. The external electrodes 136 electrically connect to a printed circuit board or similar member when the surface mount type quartz crystal device 100 is mounted on the printed circuit board or similar member (not shown).

The pedestal blank 120 is formed of the same quartz-crystal material as the quartz-crystal vibrating piece 110. A pair of metal films 122 are formed on the surface at the −Y'-axis side of the pedestal blank 120 so that the metal films 122 are aligned in the Z'-axis direction, and each of the metal films 122 are extracted to the surface at the +Y'-axis side. The pedestal blank 120 is placed on the placing portions 132 of the ceramic package 130. The length of the pedestal blank 120 in the Z'-axis direction is formed longer than that of the pedestal blank 120 in the X-axis direction.

Respective excitation electrodes 111 are formed on the surface at the +Y'-axis side and the surface at the −Y'-axis side of the quartz-crystal vibrating piece 110, and extraction electrodes 112 are extracted from the respective excitation electrodes 111 to the side at the −X-axis side of the quartz-crystal vibrating piece 110. The extraction electrode 112, which is extracted from an excitation electrode 111 formed on the surface at the +Y'-axis side, is extracted to the −Z'-axis side of the −X-axis side and further extracted to the surface at the −Y'-axis side through the side surface at the −Z'-axis side. The extraction electrode 112, which is extracted from the excitation electrode 111 formed on the surface at the −Y'-axis side, is extracted to the +Z'-axis side of the −X-axis side and further extracted to the surface at the +Y'-axis side through the side surface at the +Z'-axis side. The quartz-crystal vibrating piece 110 is placed on the pedestal blank 120.

Figure 2:
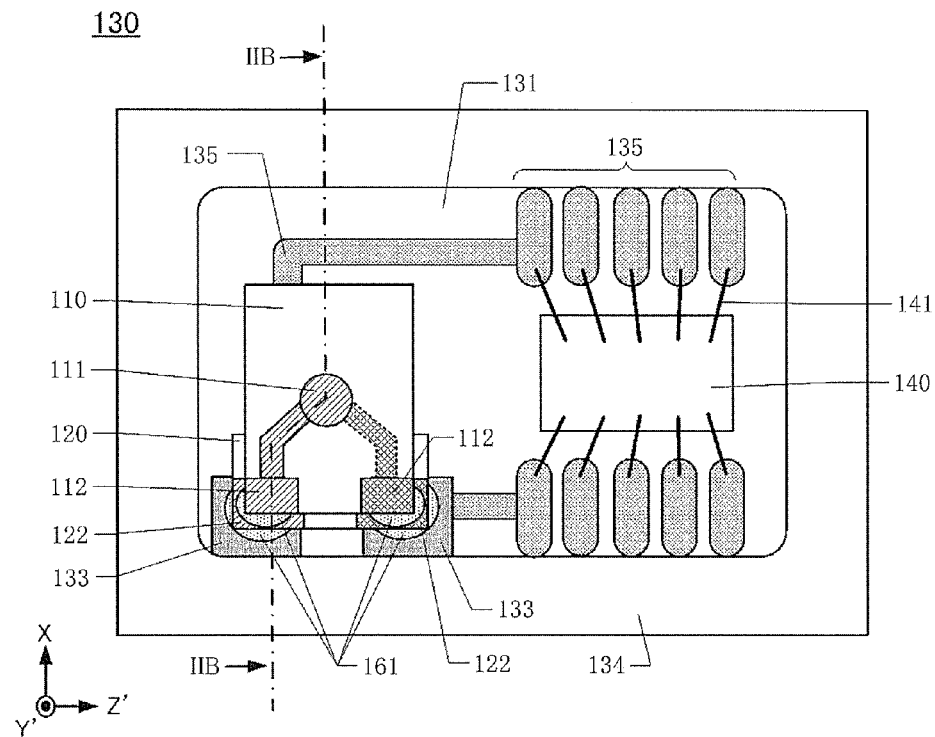
FIG. 2A is a plan view illustrating a ceramic package 130 where a quartz-crystal vibrating piece 110, a pedestal blank 120 and an integrated circuit element 140 are placed.
FIG. 2B is a cross-sectional view taken along the line IIB-IIB of FIG. 1.
Figure 2:
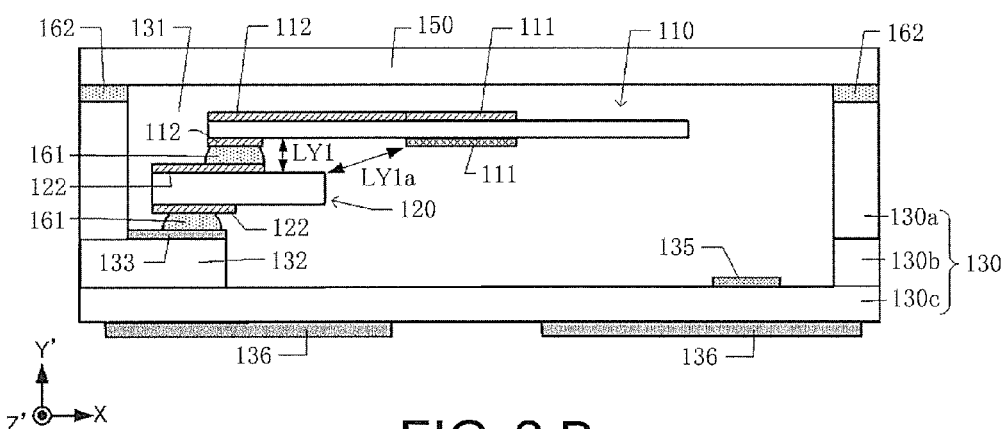

The lid plate 150 is to be bonded to the bonding surface 134 of the ceramic package 130 via a sealing material 162 (see FIG. 2B). This blocks the depressed portion 131 of the ceramic package 130 and seals the quartz-crystal vibrating piece 110, the pedestal blank 120 and the integrated circuit element 140 in the depressed portion 131.

FIG. 2A is a plan view of the ceramic package 130 where the quartz-crystal vibrating piece 110, the pedestal blank 120, and the integrated circuit element 140 are placed. A plurality of lead electrodes 135 are formed in the depressed portion 131 of the ceramic package 130. The lead electrodes 135 electrically connect to the connecting electrodes 133, the external electrodes 136 (see FIG. 2B), and similar. The integrated circuit element 140 is placed on the depressed portion 131, and a plurality of aluminum electrodes (not shown) that are formed on the surface at the +Y'-axis side of the integrated circuit element 140 and the lead electrodes 135 are electrically connected via a bonding wire 141. In addition, in the surface mount type quartz crystal device 100, the quartz-crystal vibrating piece 110 and the pedestal blank 120 are placed at the position so as to avoid overlap with the integrated circuit element 140 in the Y'-axis direction.

FIG. 2B is a cross-sectional view taken along the line IIB-IIB of FIG. 1. In addition, FIG. 2B includes a cross section taken along the line IIB-IIB of FIG. 2A. The pedestal blank 120 is placed on the placing portion 132 by connecting the metal film 122 on the pedestal blank 120 and the connecting electrode 133 that formed at the placing portion 132 via a conductive adhesive 161. In the pedestal blank 120, since the metal film 122 is formed at the end of the −X-axis side on the surface at the −Y'-axis side of the pedestal blank 120, the conductive adhesive 161 is bonded to the end of the −X-axis side on the surface at the −Y'-axis side of the pedestal blank 120. In addition, the quartz-crystal vibrating piece 110 is placed on the pedestal blank 120 by connecting the extraction electrode 112 and the metal film 122 on the pedestal blank 120 via the conductive adhesive 161. This electrically connects the excitation electrode 111 on the quartz-crystal vibrating piece 110 from the integrated circuit element 140. In this case, a distance LY1 is formed as the distance between the quartz-crystal vibrating piece 110 and the pedestal blank 120. However, the excitation electrode 111 on the quartz-crystal vibrating piece 110 is arranged so as not to have the pedestal blank 120 and the conductive adhesive 161 overlapped in the Y'-axis direction that is the normal direction, and formed so that a shortest distance LY1a between the excitation electrode 111 at the −Y'-axis side on the quartz-crystal vibrating piece 110 and the pedestal blank 120 is longer than the distance LY1.

DLD Characteristic of Surface Mount Type Quartz Crystal Device 100

While the surface mount type quartz crystal device 100 is formed so that the excitation electrode 111 and the pedestal blank 120 don't overlap with each other in the Y'-axis direction, a conventional surface mount type quartz crystal device is formed so that a pedestal blank extends longer than the pedestal blank 120 in the +X-axis direction and the distance between the excitation electrode 111 at the −Y'-axis side on the quartz-crystal vibrating piece 110 and the pedestal blank 120 is equal to the distance LY1. In the conventional surface mount type quartz crystal device described above, when the rate of the frequency change Δf of the quartz-crystal vibrating piece 110 with respect to a vibration frequency f0 is set to Δf/f0, a relation that a crystal impedance (CI) value increases as Δf/f0 increases is found.

The above change of the DLD characteristic in the conventional surface mount type quartz crystal device can be attributed to the blank scrap attached to the excitation electrode on the quartz-crystal vibrating piece. That is, it is considered that the above blank scrap is attached to the excitation electrode on the quartz-crystal vibrating piece to prevent the vibration of the quartz-crystal vibrating piece. Though the pedestal blank of the conventional surface mount type quartz crystal device is aimed of the same quartz-crystal material as the quartz-crystal vibrating piece, since the pedestal blank is not directly related to the vibration of the quartz-crystal vibrating piece, the pedestal blank is less polished or washed than the quartz-crystal vibrating piece in terms of cost reduction. Accordingly, the blank scrap that is constituted of inclusions and similar adhering during polishing or similar processes may be attached to the surface of the pedestal blank.

Since the shortest distance LY1a between the excitation electrode 111 and the pedestal blank 120 is longer than the distance LY1, the surface mount type quartz crystal device 100 can prevent the blank scrap from being attached to the excitation electrode 111. Accordingly, since the blank scrap that is attached to the excitation electrode 111 is reduced, Δf/f0 can be suppressed to keep the change of the DLD characteristic small. Further, it is not necessary to polish, wash, or similar the pedestal blank newly, and not resulting in increasing manufacturing costs. This is a preferred condition.

Further, the surface mount type quartz crystal device 100 is formed apart each other so as not to have the excitation electrode 111 and either of the conductive adhesive 161, the electrode, or a similar member overlapped in the Y'-axis direction. Accordingly, it is not likely to generate the floating capacity between the excitation electrode 111 and either of the conductive adhesive 161, the electrode, or a similar member, and it can prevent the variation in the vibration frequency. This is a preferred condition.

Second Embodiment

The pedestal blank can include various shapes. Hereinafter, a description will be given of the surface mount type quartz crystal device that includes a variant example of the pedestal blank. The second embodiment will now be described wherein like reference numerals designate corresponding or identical elements throughout the embodiments.

Constitution of Surface Mount Type Quartz Crystal Device 200

Figure 3:
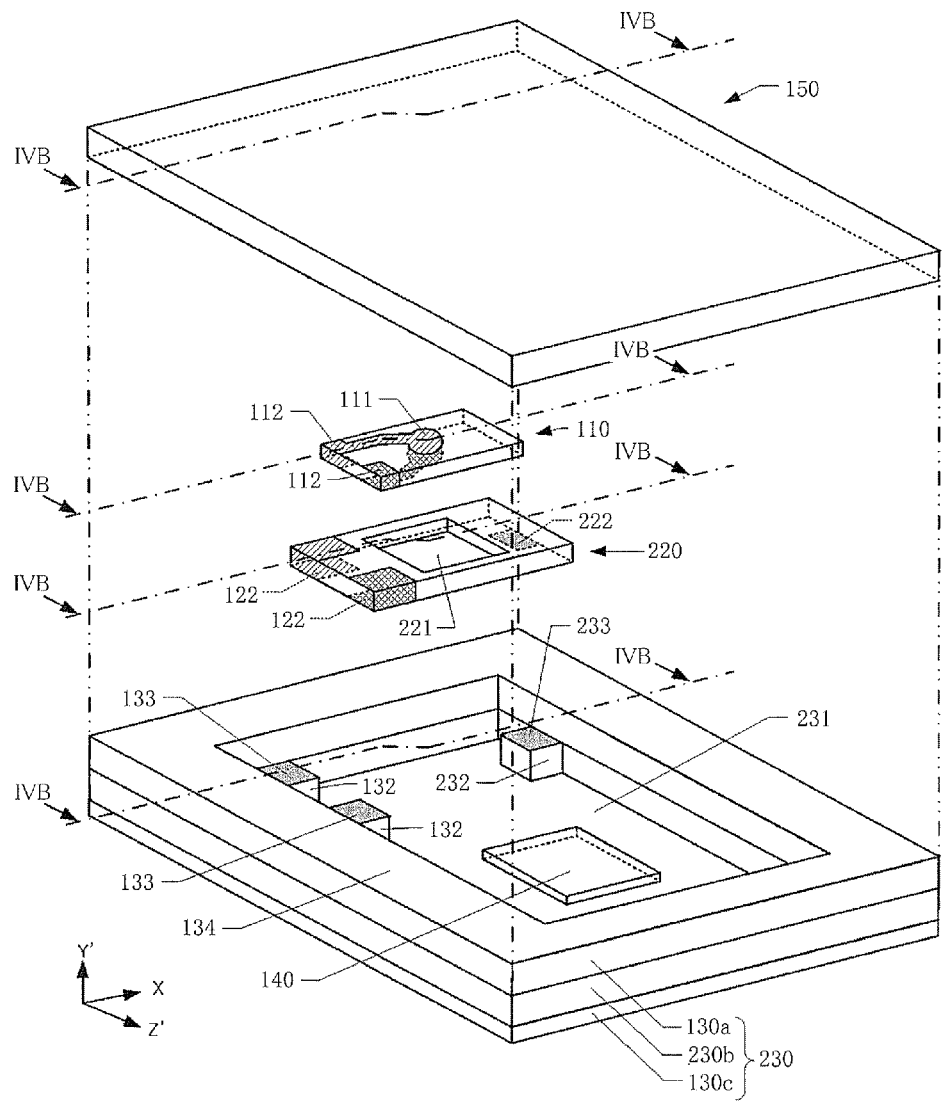
FIG. 3 is an exploded perspective view illustrating a surface mount type quartz crystal device 200.

FIG. 3 is an exploded perspective view of a surface mount type quartz crystal device 200. The surface mount type quartz crystal device 200 mainly includes a ceramic package 230, the integrated circuit element 140, a pedestal blank 220, the quartz-crystal vibrating piece 110, and the lid plate 150. The surface mount type quartz crystal device 200 is formed as a surface mount type crystal controlled oscillator. The ceramic package 230 includes a depressed portion 231 having the surface at the +Y'-axis side opened, and the depressed portion 231 forms the same placing portions 132 as that of the surface mount type quartz crystal device 100, and a placing portion 232. The placing portions 232 is formed at the −Z'-axis side of the side surface at the +X-axis side in the depressed portion 231 and a metal film 233 is formed on the surface of the placing portion 232. The ceramic package 230 is formed of three layers: the first layer 130a, a second layer 230b, and the third layer 130c by overlapping the three layers. The second layer 230b forms the placing portions 132 and the placing portion 232.

The pedestal blank 220 is formed of the same quartz-crystal material as the quartz-crystal vibrating piece 110, and a depressed portion 221 depressed in the −Y'-axis direction is included near the center of the surface at the +Y'-axis side facing the quartz-crystal vibrating piece 110. In addition, the metal films 122 are formed on the pedestal blank 220, and a metal film 222 is formed at the center of the side at the +X-axis side of the surface at the −Y'-axis side.

Figure 4:
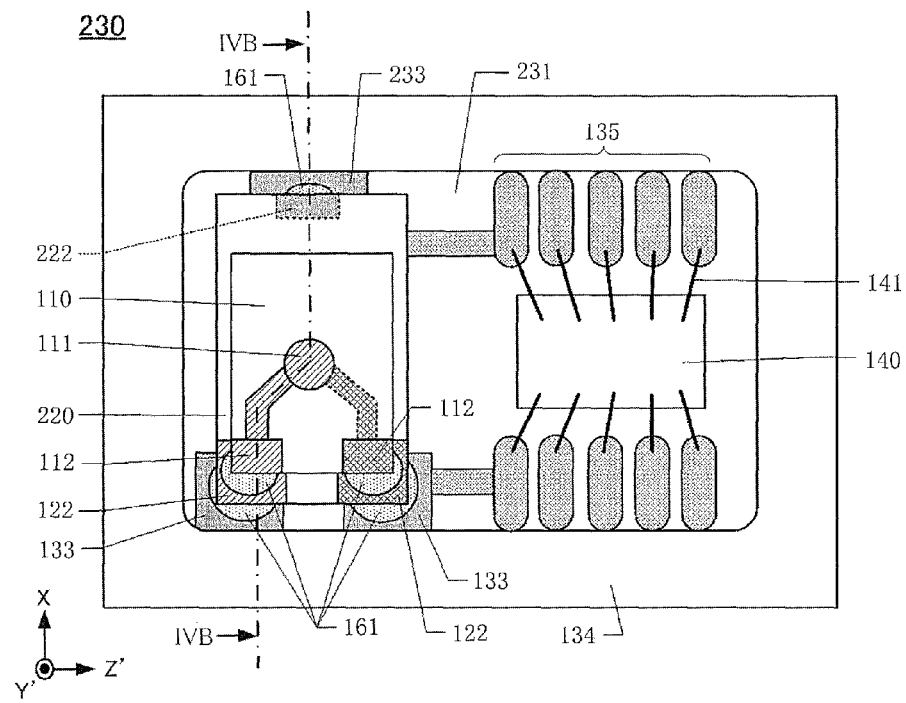
FIG. 4A is a plan view of a ceramic package 230 where a quartz-crystal vibrating piece 110, a pedestal blank 220, and an integrated circuit element 140 are placed.
FIG. 4B is a cross-sectional view taken along the line IVB-IVB of FIG. 3.
Figure 4:
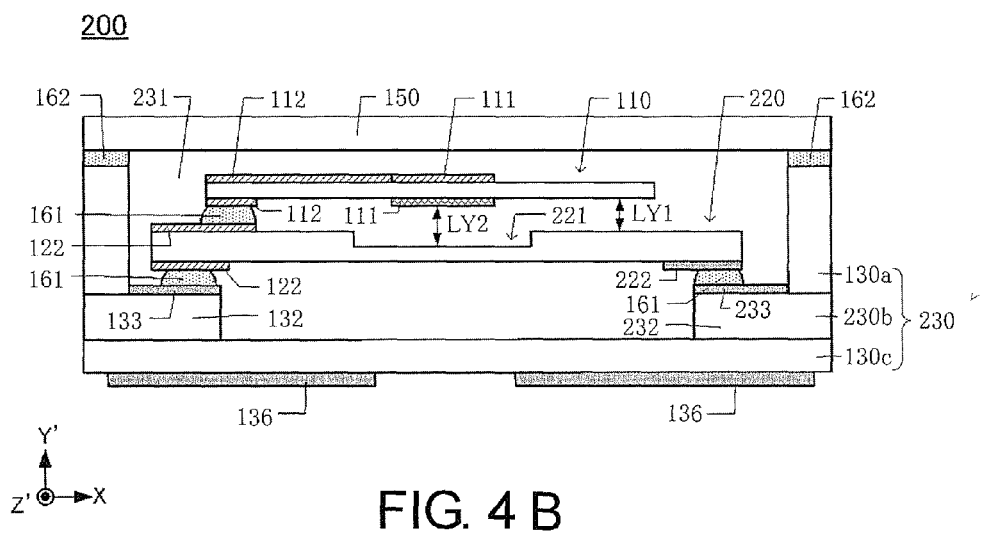

FIG. 4A is a plan view of the ceramic package 230 where the quartz-crystal vibrating piece 110, the pedestal blank 220, and the integrated circuit element 140 are placed. The pedestal blank 220 is placed on a pair of connecting electrodes 133 and the metal film 233. Therefore, the pedestal blank 220 is held at three points to be stably placed on the depressed portion 231.

FIG. 4B is a cross-sectional view taken along the line IVB-IVB of FIG. 3. In addition, FIG. 4B includes a cross section taken along the line IVB-IVB of FIG. 4A. The pedestal blank 220 is placed on the depressed portion 231 by connecting each of the metal films 122 and each of the connecting electrodes 133 via the conductive adhesive 161, and connecting the metal film 222 and the metal film 233 via the conductive adhesive 161. Further, the excitation electrode 111 that is formed on the quartz-crystal vibrating piece 110 and the depressed portion 221 on the pedestal blank 220 are formed overlapping with each other in the Y'-axis direction. Accordingly, a distance LY2 in the Y'-axis direction between the excitation electrode 111 on the surface of the −Y'-axis side on the quartz-crystal vibrating piece 110 and the pedestal blank 220 is formed to be longer than the distance LY1 between the quartz-crystal vibrating piece 110 and the pedestal blank 220. This can prevent the blank scrap on the pedestal blank 220 from being attached to the excitation electrode 111, similarly to the surface mount type quartz crystal device 100. Further, since the metal films 122 and the metal film 222 on the pedestal blank 220 are formed along an outer peripheral side at the end of the +X-axis side and the −X-axis side, the excitation electrode 111 and the conductive adhesive 161 or the metal films 122 and 222, and similar don't overlap with each other in the Y'-axis direction, and are formed apart from each other. Accordingly, it is not likely to generate the floating capacity between the excitation electrode 111 and either of the conductive adhesive 161, the electrode, and similar, and it can prevent the variation in the vibration frequency. This is a preferred condition.

Constitution of Surface Mount Type Quartz Crystal Device 300

Figure 5:
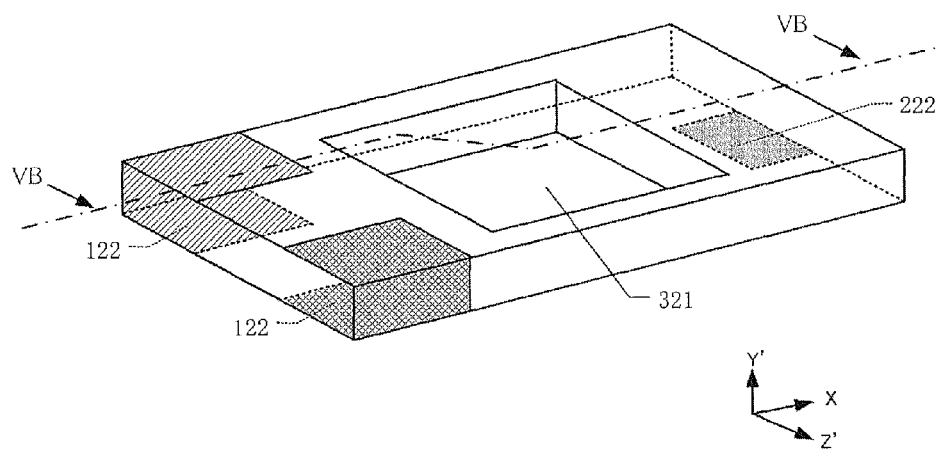
FIG. 5A is a perspective view illustrating a pedestal blank 320.
FIG. 5B is a cross-sectional view illustrating a surface mount type quartz crystal device 300 taken along the line VB-VB of FIG. 5A.
Figure 5:
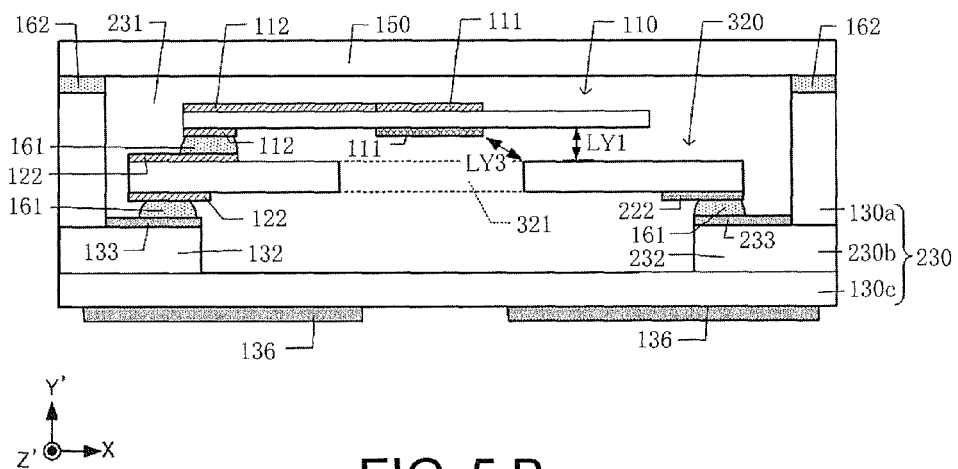

FIG. 5A is a perspective view of a pedestal blank 320. In the surface mount type quartz crystal device 100, the pedestal blank 320 may be used instead of the pedestal blank 120. Hereinafter, a description will be given of a surface mount type crystal controlled oscillator that uses the pedestal blank 320 as a surface mount type quartz crystal device 300.

The pedestal blank 320 is formed so that the long side of the pedestal blank 320 is extended in the X-axis direction and the short side of the pedestal blank 320 is extended in the Z'-axis direction. In addition, the metal films 122 and the metal film 222 are formed at the end of the +X-axis side and the −X-axis side of the pedestal blank 320, similarly to the pedestal blank 220. On the other hand, in the pedestal blank 320, a through hole 321 that penetrates through the pedestal blank 320 in the Y'-axis direction is formed at a place where the depressed portion 221 is included in the pedestal blank 220, unlike the pedestal blank 220.

FIG. 5B is a cross-sectional view of the surface mount type quartz crystal device 300. FIG. 5B shows a cross section corresponding to the same part of the FIG. 4B, and includes a cross section taken along the line VB-VB of FIG. 5A. The surface mount type quartz crystal device 300 includes the quartz-crystal vibrating piece 110, the pedestal blank 320, the ceramic package 230, the integrated circuit element 140, and the lid plate 150. In the surface mount type quartz crystal device 300, the through hole 321 on the pedestal blank 320 and the excitation electrode 111 on the quartz-crystal vibrating piece 110 are formed overlapping with each other in the Y'-axis direction. Accordingly, a shortest distance LY3 between the excitation electrode 111 at the −Y'-axis side on the quartz-crystal vibrating piece 110 and the pedestal blank 320 is formed to be longer than the distance LY1, and the pedestal blank 320 can prevent the blank scrap from being attached to the excitation electrode 111 on the quartz-crystal vibrating piece 110.

Third Embodiment

In the surface mount type quartz crystal device, the X-axis of the quartz-crystal vibrating piece may be arranged so as to fit the long side of the ceramic package. Hereinafter, a description will be given of a surface mount type quartz crystal device 400 where the long side of the ceramic package extends in the X-axis direction.
Constitution of Surface Mount Type Quartz Crystal Device 400

Figure 6:
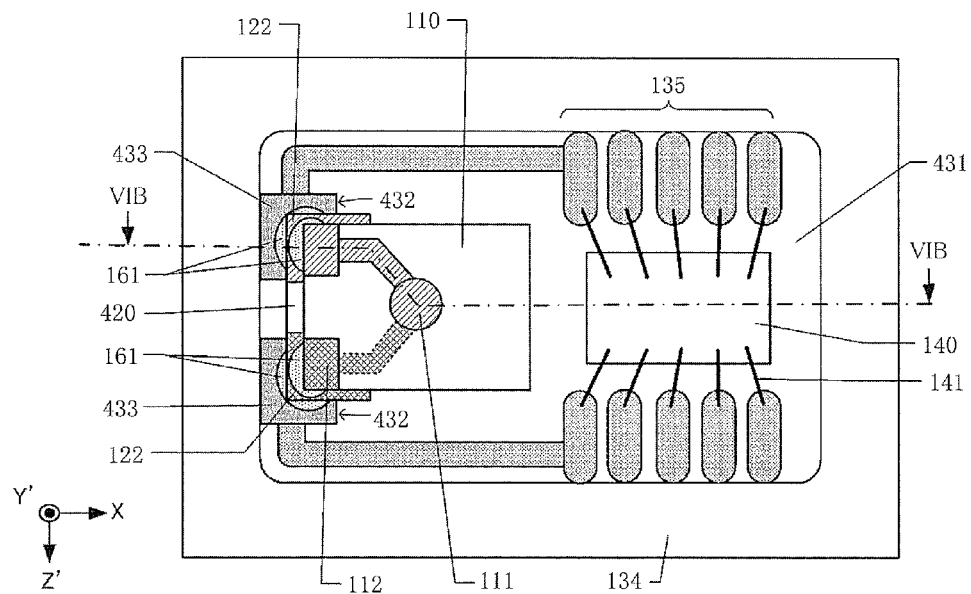
FIG. 6A is a plan view illustrating a ceramic package 430 where a quartz-crystal vibrating piece 110, a pedestal blank 420 and an integrated circuit element 140 are placed.
FIG. 6B is a cross-sectional view illustrating a surface mount type quartz crystal device 400 taken along the line VIB-VIB of FIG. 6A.
Figure 6:
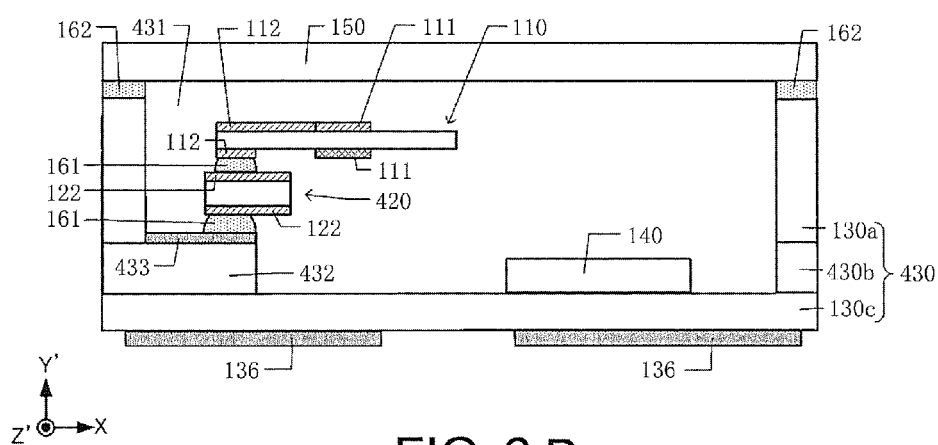

FIG. 6A is a plan view of a ceramic package 430 where the quartz-crystal vibrating piece 110, a pedestal blank 420, and the integrated circuit element 140 are placed. The surface mount type quartz crystal device 400 includes the quartz-crystal vibrating piece 110, the pedestal blank 420, the integrated circuit element 140, the ceramic package 430, and the lid plate 150. The surface mount type quartz crystal device 400 is formed as a surface mount type crystal controlled oscillator. As illustrated in FIG. 6A, the ceramic package 430 includes a depressed portion 431, and the quartz-crystal vibrating piece 110 is placed on the depressed portion 431. In the surface mount type quartz crystal device 400, the quartz-crystal vibrating piece 110 is placed on the ceramic package 430 so that the X-axis direction of the quartz-crystal vibrating piece 110 corresponds to a direction that the long side of the ceramic package 430 extends.

A pair of placing portions 432 are formed on the side surface at the −X-axis side in the depressed portion 431 and connecting electrodes 433 are formed on the surface at the +Y'-axis side of the pair of the placing portions 432. The pedestal blank 420 is placed on the pair of placing portions 432, and the quartz-crystal vibrating piece 110 is placed on the pedestal blank 420. The pedestal blank 420 is formed so that the short side of the pedestal blank 420 is extended in the X-axis direction and the long side of the pedestal blank 420 is extended in the Z'-axis direction, similarly to the pedestal blank 120 (see FIG. 1). In addition, a pair of the metal films 122 similar to the pedestal blank 120 are formed on the pedestal blank 420. In addition, in the surface mount type quartz crystal device 400, the quartz-crystal vibrating piece 110 and the integrated circuit element 140 are arranged so as to avoid overlap with each other in the Y'-axis direction.

FIG. 6B is a cross-sectional view of the surface mount type quartz crystal device 400. The cross-sectional view of FIG. 6B includes a cross section taken along the line VIB-VIB of FIG. 6A. The ceramic package 430 is formed of three layers: the first layer 130a, a second layer 430b, and the third layer 130c by overlapping the three layers. The second layer 430b forms the placing portion 432. In addition, in the surface mount type quartz crystal device 400, excitation electrode 111 on a quartz-crystal vibrating piece 410 and the pedestal blank 420 are arranged so as to avoid overlap with each other in the Y'-axis direction. This can prevent the blank scrap that is attached to the pedestal blank 420 from being attached to the excitation electrode 111, similarly to the first embodiment.

Fourth Embodiment

In the surface mount type quartz crystal device, the quartz-crystal vibrating piece and the integrated circuit element may be arranged in the rooms different from each other. Hereinafter, a description will be given of a surface mount type quartz crystal device 500 where the quartz-crystal vibrating piece and the integrated circuit element are arranged in the rooms different from each other.
Constitution of Surface Mount Type Quartz Crystal Device 500

Figure 7:
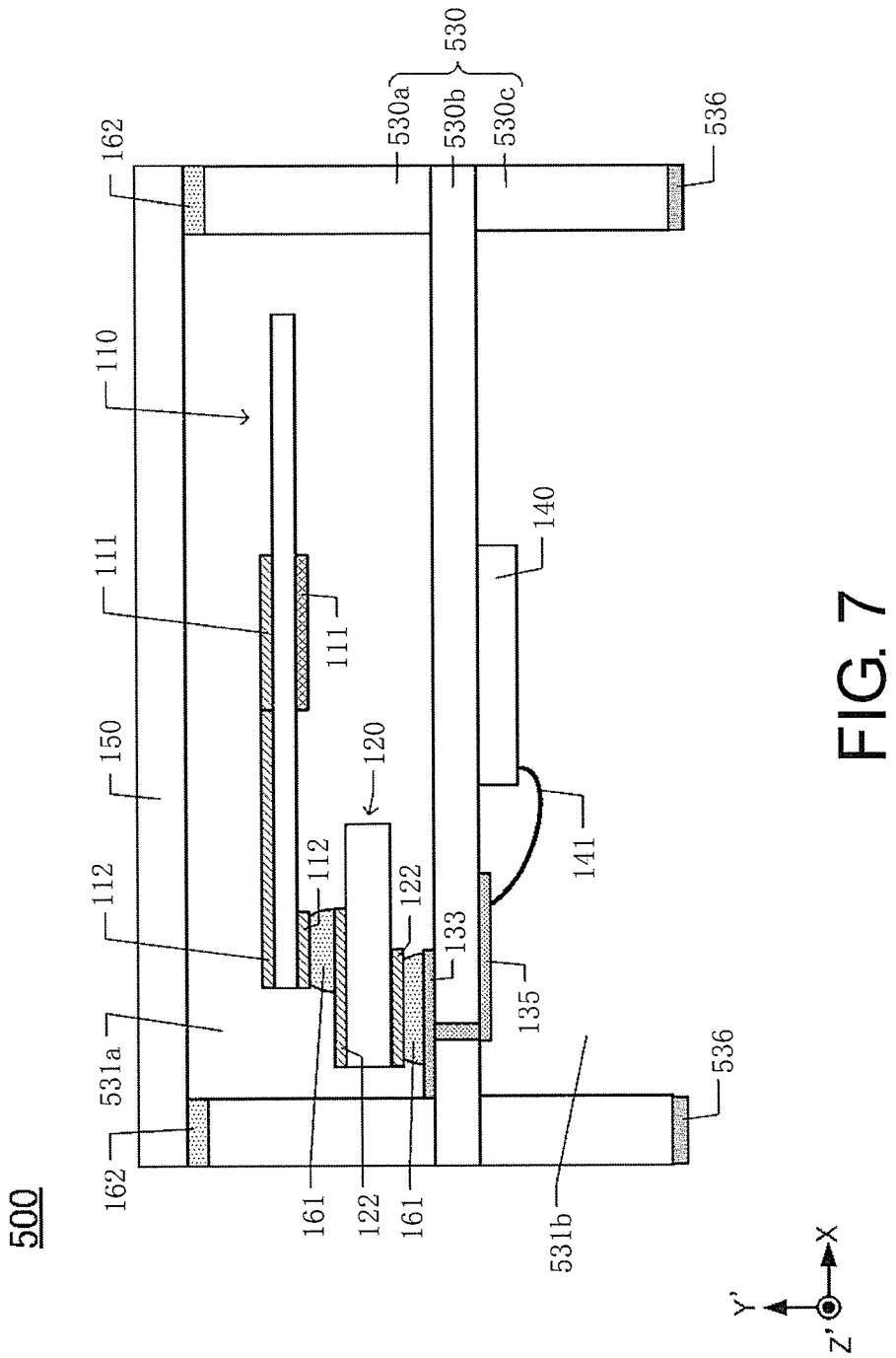
FIG. 7 is a cross-sectional view illustrating a surface mount type quartz crystal device 500.

FIG. 7 is a cross-sectional view of the surface mount type quartz crystal device 500. The surface mount type quartz crystal device 500 includes the quartz-crystal vibrating piece 110, the pedestal blank 120, the integrated circuit element 140, a ceramic package 530, and the lid plate 150. The surface mount type quartz crystal device 500 is formed as a surface mount type crystal controlled oscillator. The ceramic package 530 includes respective depressed portions at the +Y'-axis side and the −Y'-axis side. The quartz-crystal vibrating piece 110 is placed at a depressed portion 531a on the surface at the +Y'-axis side via the pedestal blank 120, and the integrated circuit element 140 is arranged at a depressed portion 531b on the surface at the −Y'-axis side.

The ceramic package 530 is formed of three layers: a first layer 530a, a second layer 530b, and a third layer 530c by overlapping the three layers. The first layer 530a is arranged at the +Y'-axis side of the ceramic package 530, and forms the side surface of the depressed portion 531a. The second layer 530b is a layer partitioning the depressed portion 531a and the depressed portion 531b and is bonded to the surface at the −Y'-axis side of the first layer 530a. The third layer 530c is bonded to the surface at the −Y'-axis side of the second layer 530b, and forms the side surface of the depressed portion 531b. In addition, the depressed portion 531a is sealed by the lid plate 150, and external electrodes 536 are formed on the surface at the −Y'-axis side of the third layer 530c.

In the surface mount type quartz crystal device 500, since the quartz-crystal vibrating piece 110 is placed on the depressed portion 531a via the pedestal blank 120, the change of the DLD characteristic, which is caused by a difference in thermal expansion coefficients between the ceramic package 530 and the quartz-crystal vibrating piece 110, can be prevented. This is a preferred condition.

Fifth Embodiment

The surface mount type quartz crystal device may be formed as a surface mount type quartz-crystal vibrator that does not include the integrated circuit element. Hereinafter, a description will be given of the surface mount type quartz crystal unit that does not include the integrated circuit element.

Constitution of Surface Mount Type Quartz Crystal Device 600

Figure 8:
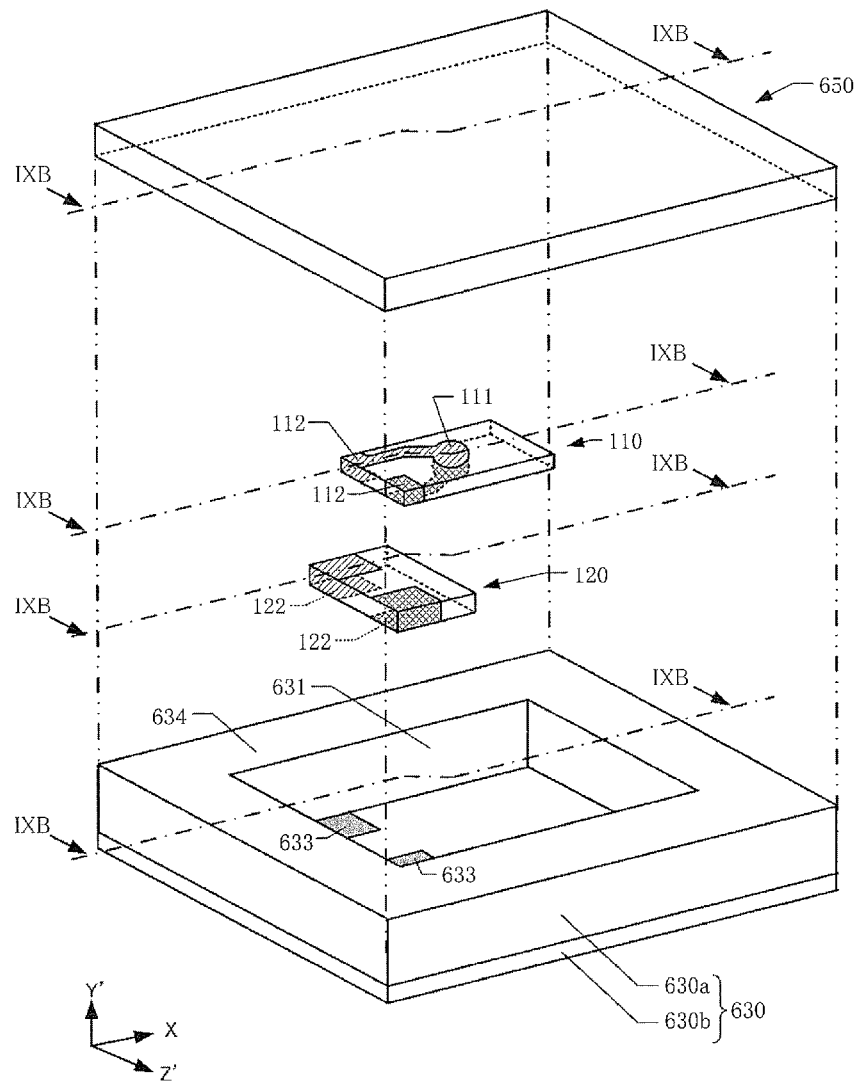
FIG. 8 is a perspective view illustrating a surface mount type quartz crystal device 600.

FIG. 8 is a perspective view of the surface mount type quartz crystal device 600. The surface mount type quartz crystal device 600 includes the quartz-crystal vibrating piece 110, the pedestal blank 120, a ceramic package 630, and a lid plate 650, and is formed as a surface mount type quartz-crystal vibrator. As illustrated in FIG. 6A, the ceramic package 630 includes a depressed portion 631 on the surface at the +Y'-axis side, and the quartz-crystal vibrating piece 110 is placed on the depressed portion 631 via the pedestal blank 120.

The ceramic package 630 is made of ceramics and includes a depressed portion 631 having the surface at the +Y'-axis side opened. A pair of connecting electrodes 633 on which the pedestal blank 120 is placed are formed along the side at the −X-axis side in the depressed portion 631.

The ceramic package 630 is formed of two layers: a first layer 630a, and a second layer 630b by overlapping the two layers. The first layer 630a is arranged at the +Y'-axis side of the ceramic package 630, and a bonding surface 634 is formed on the surface at the +Y'-axis side of the first layer 630a. The bonding surface 634 is to be bonded to the lid plate 650. The second layer 630b is formed on the surface at the −Y'-axis side of the first layer 630a. External electrodes 636 (see FIG. 9B) are formed on the surface at the −Y'-axis side of the second layer 630b. The external electrodes 636 electrically connect to a printed circuit board or similar member when the surface mount type quartz crystal device 600 is mounted on the printed circuit board or similar member (not shown).

Figure 9:
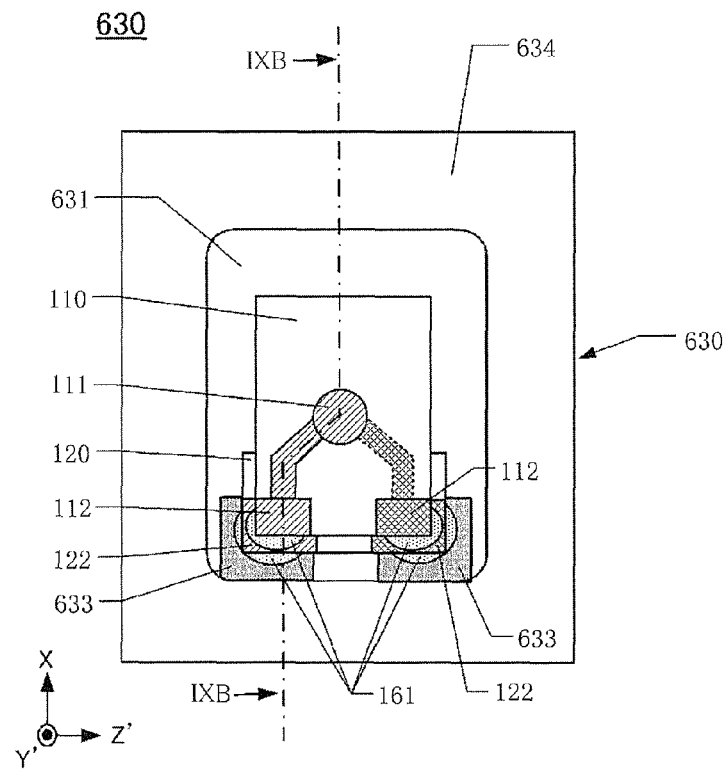
FIG. 9A is a plan view of a ceramic package 630 where a quartz-crystal vibrating piece 110 and a pedestal blank 120 are placed.
FIG. 9B is a cross-sectional view taken along the line IXB-IXB of FIG. 8.
Figure 9:
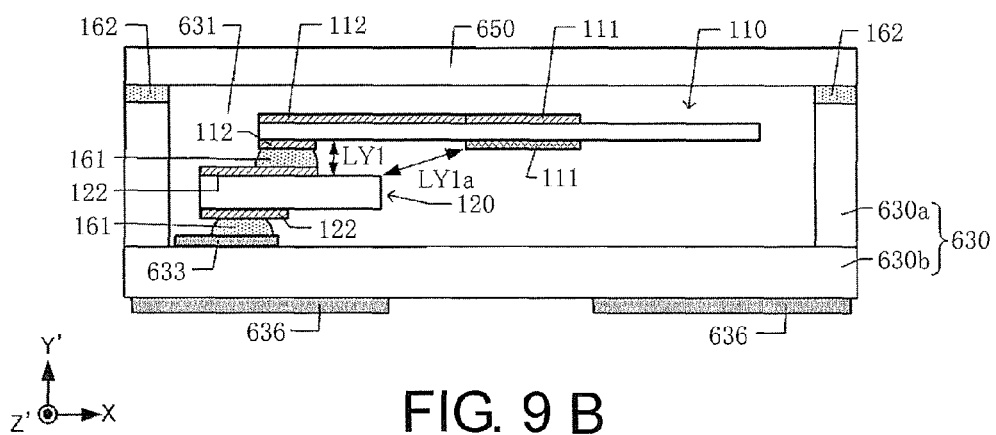

The lid plate 650 is to be bonded to the bonding surface 634 of the ceramic package 630 via the sealing material 162 (see FIG. 9B). This blocks the depressed portion 631 of the ceramic package 630 and seals the quartz-crystal vibrating piece 110 and the pedestal blank 120 in the depressed portion 631.

FIG. 9A is a plan view of the ceramic package 630 where the quartz-crystal vibrating piece 110 and the pedestal blank 120 are placed. In the surface mount type quartz crystal device 600, the quartz-crystal vibrating piece 110 is placed on the depressed portion 631 of the ceramic package 630 so that the X-axis direction of the quartz-crystal vibrating piece 110 corresponds to a direction that the long side of the ceramic package 630 extends. The size of the depressed portion 631 and the position that the connecting electrodes 633 are formed are made according to the size of the quartz-crystal vibrating piece 110 and the pedestal blank 120, and the position where the electrodes are formed.

FIG. 9B is a cross-sectional view taken along the line IXB-IXB of FIG. 8. In addition, FIG. 9B includes a cross section taken along the line IXB-IXB of FIG. 9A. The connecting electrode 633 formed at the depressed portion 631 is electrically connected to the external electrode 636. The pedestal blank 120 is placed on the placing portion 132 by connecting the metal film 122 on the pedestal blank 120 and the connecting electrode 633 formed at the placing portion 132 via a conductive adhesive 161. In addition, the quartz-crystal vibrating piece 110 is placed on the pedestal blank 120 by connecting the extraction electrode 112 and the metal film 122 on the pedestal blank 120 via the conductive adhesive 161. In the surface mount type quartz crystal device 600, the excitation electrode 111 on the quartz-crystal vibrating piece 110 is arranged so as not to have the pedestal blank 120 and the conductive adhesive 161 overlapped in the Y'-axis direction that is the normal direction, similarly to the surface mount type quartz crystal device 100 (see FIG. 2B). The excitation electrode 11 is formed so that the shortest distance LY1a between the excitation electrode 111 on the quartz-crystal vibrating piece 110 at the −Y'-axis side and the pedestal blank 120 is longer than the distance LY1.

In the surface mount type quartz crystal device 600, since the blank scrap that is attached to the excitation electrode 111 is reduced, similarly to the surface mount type quartz crystal device 100, Δf/f0 can be suppressed to keep the change of the DLD characteristic small. Further, it is not necessary to polish, wash, or similar the pedestal blank newly, and not resulting in increasing manufacturing costs. In addition, in the surface mount type quartz crystal device 600, the pedestal blank 220 (see FIG. 3) or the pedestal blank 320 (see FIG. 5A) may be used instead of the pedestal blank 120.

Constitution of Surface Mount Type Quartz Crystal Device 700

When the ceramic package 630 is subject to impact or similar, the end of the +X-axis side, to which the quartz-crystal vibrating piece 110 of the surface mount type quartz crystal device 600 is not fixed, may vibrate in the Y'-axis direction. In the surface mount type quartz crystal device 600, since the pedestal blank 120 may also vibrate in the Y'-axis direction due to impact or similar, the amplitude of the quartz-crystal vibrating piece 110 in the Y'-axis direction may be larger than that of the quartz-crystal vibrating piece of the surface mount type quartz crystal device that does not use the pedestal blank. In this case, there are concerns that the quartz-crystal vibrating piece 110 is broken due to contact with the lid plate 650, a large stress is applied to a connection part between the quartz-crystal vibrating piece 110 and the conductive adhesive 161, and the bonded portion between the quartz-crystal vibrating piece 110 and the conductive adhesive 161 becomes weakened.

Accordingly, in the surface mount type quartz crystal device 600, a pillow portion 770 may be provided in the ceramic package 630 to suppress the vibration of the quartz-crystal vibrating piece 110. Hereinafter, a description will be given of a surface mount type quartz crystal device 700 that is formed by providing the pillow portion 770 in the ceramic package 630 of the surface mount type quartz crystal device 600.

Figure 10:
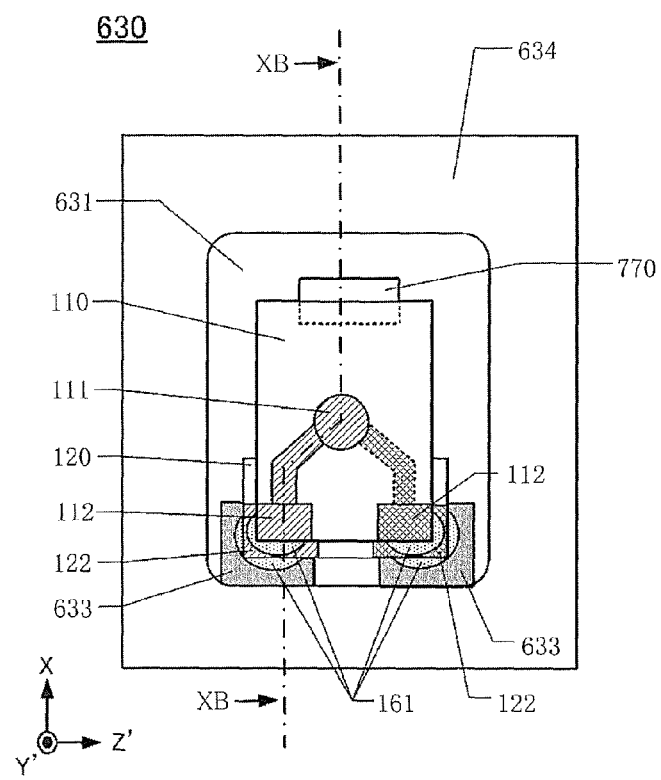
FIG. 10A is a plan view of a ceramic package 630 where a quartz-crystal vibrating piece 110 and a pedestal blank 120 are placed and a pillow portion 770 is provided.
FIG. 10B is a cross-sectional view illustrating a surface mount type quartz crystal device 700 including a cross section taken along the line XB-XB of FIG. 10A.
Figure 10:
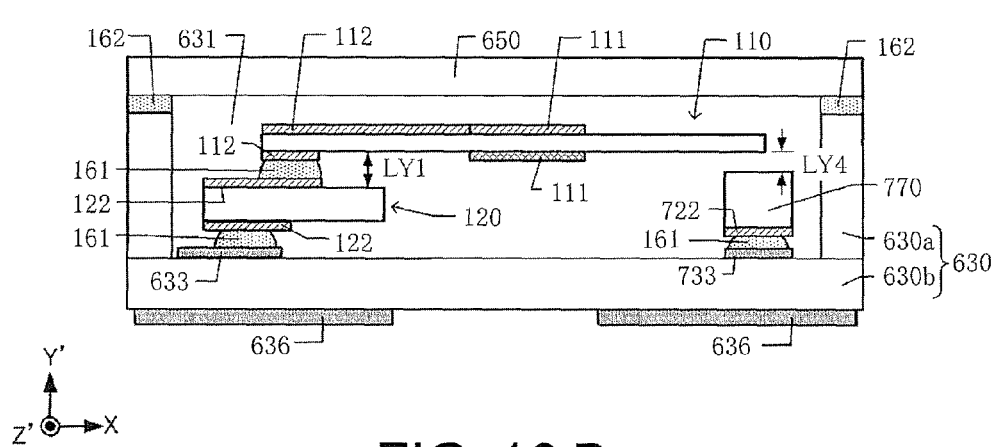

FIG. 10A is a plan view of the ceramic package 630 where the quartz-crystal vibrating piece 110 and the pedestal blank 120 are placed and the pillow portion 770 is provided. In the ceramic package 630 illustrated in FIG. 10A, the pedestal blank 120 and the quartz-crystal vibrating piece 110, which is placed on the pedestal blank 120, are placed on the depressed portion 631, and the pillow portion 770 is further arranged in the region near the +X-axis side on the surface at the −Y'-axis side in the depressed portion 631 of the ceramic package 630. The pillow portion 770 is arranged so that a portion of the pillow portion 770 overlaps with the end of the +X-axis side of the quartz-crystal vibrating piece 110 in the Y'-axis direction.

FIG. 10B is a cross-sectional view of the surface mount type quartz crystal device 700 including a cross section taken along the line XB-XB of FIG. 10A. A metal film 733 is formed at the +X-axis side on the bottom surface in the depressed portion 631 of the ceramic package 630. The metal film 733 is not electrically connected to any other electrode in the ceramic package 630. In addition, the pillow portion 770 is formed of the quartz-crystal material, for example, but a metal film 722 is fainted on the surface at the −Y'-axis side of the pillow portion 770, and the metal film 722 and the metal film 733 are to be bonded via the conductive adhesive 161 to fix the pillow portion 770 in the depressed portion 631. When a distance between the pillow portion 770 and the quartz-crystal vibrating piece 110 is defined as LY4, it is preferred that LY4 is formed to be equal to or shorter than the distance LY1.

In the quartz-crystal vibrating piece 110 of the surface mount type quartz crystal device 700, since the pillow portion 770 is formed, the amplitude of the quartz-crystal vibrating piece 110 in the Y'-axis direction can be suppressed to be the distance LY4 or less. This can prevent concerns that the quartz-crystal vibrating piece 110 is broken due to contact with the lid plate 650, a large stress is applied to a connection part between the quartz-crystal vibrating piece 110 and the conductive adhesive 161, the connection between the quartz-crystal vibrating piece 110 and the conductive adhesive 161 becomes weakened, and similar.

In addition, in the surface mount type quartz crystal device 700, a pillow portion may be provided by forming a portion of the ceramic package at the position where the pillow portion 770 is arranged so as to be protruded in the depressed portion 631, similarly to the placing portion 132 of the surface mount type quartz crystal device 100. Further, in order to reduce the impact of the quartz-crystal vibrating piece 110 when contacting, a metal film may be formed at the +Y'-axis side of the pillow portion 770 by a soft metal.

Representative embodiments are described in detail above; however, as will be evident to those skilled in the relevant art, this disclosure may be changed or modified in various ways within its technical scope.

A surface mount type quartz crystal device according to a second aspect of the disclosure includes a ceramic package, a pedestal blank, a quartz-crystal vibrating piece. The pedestal blank is formed of a quartz-crystal material. The pedestal blank is placed within the ceramic package via a conductive adhesive. The quartz-crystal vibrating piece is formed in a rectangular shape having a long side and a short side. The quartz-crystal vibrating piece includes a pair of excitation electrodes and a pair of extraction electrodes. The pair of extraction electrodes are extracted from the pair of excitation electrodes to one end of the quartz-crystal vibrating piece in an extending direction of the long side. The quartz-crystal vibrating piece is placed on the pedestal blank. The conductive adhesive is formed along an outer peripheral side of the pedestal blank so as to avoid overlap with the excitation electrode viewed in a height direction of the excitation electrode. The pedestal blank has a through hole passing through the pedestal blank in a region overlap with the excitation electrode in the pedestal blank, viewed in a normal direction of the excitation electrode.

A surface mount type quartz crystal device according to a third aspect of the disclosure includes a ceramic package, a rectangular-shaped pedestal blank, a quartz-crystal vibrating piece. The rectangular-shaped pedestal blank is formed of a quartz-crystal material. The pedestal blank is placed within the ceramic package via a conductive adhesive. The quartz-crystal vibrating piece is formed in a rectangular shape having a long side and a short side. The quartz-crystal vibrating piece includes a pair of excitation electrodes and a pair of extraction electrodes. The pair of extraction electrodes are extracted from the pair of excitation electrodes to one end of the quartz-crystal vibrating piece in an extending direction of the long side. The quartz-crystal vibrating piece is placed on the pedestal blank. The conductive adhesive is formed to avoid overlap with the excitation electrode in a normal direction of the excitation electrode. The pedestal blank has a length along the extending direction of the long side that is shorter than a length of the quartz-crystal vibrating piece along the extending direction of the long side, and the pedestal blank and the excitation electrodes avoid overlap one another, viewed in the normal direction of the excitation electrode.

In the surface mount type quartz crystal device according to a fourth aspect in the surface mount type quartz crystal device according to the first or second aspect, the conductive adhesive is formed at one end or both ends of the pedestal blank in the extending direction of the long side.

In the surface mount type quartz crystal device according to a fifth aspect in the surface mount type quartz crystal device according to the third aspect further includes a pillow portion inside the ceramic package. The pillow portion overlaps another end of the quartz-crystal vibrating piece in the extending direction of the long side, viewed in the normal direction.

In the surface mount type quartz crystal device according to a sixth aspect in the surface mount type quartz crystal device according to anyone of the first to fourth aspect, the ceramic package houses an integrated circuit element.

According to this disclosure, the attachment of the blank scrap to the quartz-crystal vibrating piece can be prevented to provide the surface mount type quartz crystal device where the DLD characteristic is improved.

According to this disclosure, the pedestal blank may be formed to avoid a region where a distance from the quartz-crystal vibrating piece is equal to or smaller than a size of a clearance between the pedestal blank and the quartz-crystal vibrating piece at the outer peripheral side, in a region where the excitation electrode faces at the pedestal blank side viewed in the normal direction. This also achieves the technical effects of the disclosure.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A surface mount type quartz crystal device, having a long side direction as a Z'-axis direction, a height direction as a Y'-axis direction, and a X-axis direction perpendicular to the Y'-axis direction and the Z'-axis direction, and the surface mount type quartz crystal device comprising:
   a ceramic package;

a pedestal blank formed of a quartz-crystal material, the pedestal blank being placed within the ceramic package via a conductive adhesive;

a quartz-crystal vibrating piece formed in a rectangular shape having a long side and a short side, the quartz-crystal vibrating piece including a pair of excitation electrodes and a pair of extraction electrodes, the pair of extraction electrodes being extracted from the pair of excitation electrodes to one end of the quartz-crystal vibrating piece in an extending direction of the long side, the quartz-crystal vibrating piece being placed on the pedestal blank, wherein the conductive adhesive is formed along an outer peripheral side of the pedestal blank so as to avoid overlap with the excitation electrode viewed in a normal direction of the excitation electrode, and the Y'-axis direction is the normal direction, and the pedestal blank is formed to avoid a region where a distance from the quartz-crystal vibrating piece is equal to or smaller than a size of a clearance between the pedestal blank and the quartz-crystal vibrating piece at the outer peripheral side, in a region where the excitation electrode faces at the pedestal blank side viewed in the normal direction, and the excitation electrode on the quartz-crystal vibrating piece is arranged so as not to have the pedestal blank and the conductive adhesive overlapped in the Y'-axis direction that is the normal direction.

2. The surface mount type quartz crystal device according to claim 1, wherein
the pedestal blank has a depressed surface facing the quartz-crystal vibrating piece in the region overlap with the excitation electrode in the pedestal blank, viewed in the normal direction.

3. The surface mount type quartz crystal device according to claim 1, wherein
the pedestal blank has a through hole passing through the pedestal blank in the region overlap with the excitation electrode in the pedestal blank, viewed in the normal direction.

4. The surface mount type quartz crystal device according to claim 1, wherein
the pedestal blank has a rectangular-shape with a length along the extending direction of the long side that is shorter than a length of the quartz-crystal vibrating piece along the extending direction of the long side, so as to avoid overlap of the pedestal blank and the excitation electrodes, viewed in the normal direction.

5. The surface mount type quartz crystal device according to claim 4, further comprising:
a pillow portion inside the ceramic package, and
the pillow portion overlaps another end of the quartz-crystal vibrating piece in the extending direction of the long side, viewed in the normal direction.

6. The surface mount type quartz crystal device according to claim 1, wherein
the conductive adhesive is formed at one end or both ends of the pedestal blank in the extending direction of the long side.

7. The surface mount type quartz crystal device according to claim 1, wherein
the ceramic package houses an integrated circuit element.

* * * * *